United States Patent [19]

Maruo

[11] Patent Number: 5,407,839
[45] Date of Patent: Apr. 18, 1995

[54] MOS MANUFACTURING PROCESS HAVING REDUCED GATE INSULATOR DEFECTS

[75] Inventor: Yutaka Maruo, Suwa, Japan

[73] Assignee: Seiko Epson Corporation, Tokyo, Japan

[21] Appl. No.: 965,496

[22] Filed: Oct. 23, 1992

[30] Foreign Application Priority Data

Nov. 1, 1991 [JP] Japan .................. 3-287783

[51] Int. Cl.⁶ ........................ H01L 21/265
[52] U.S. Cl. ...................... 437/29; 437/56; 437/913
[58] Field of Search .......... 437/29, 28, 56, 57, 437/30, 913; 148/DIG. 147, DIG. 82, DIG. 83

[56] References Cited

U.S. PATENT DOCUMENTS

| | | | |
|---|---|---|---|
| 4,966,866 | 10/1990 | Mikata et al. .......... | 437/57 |
| 5,028,552 | 7/1991 | Ushiku .................. | 437/57 |
| 5,032,530 | 7/1991 | Lowery et al .......... | 437/57 |
| 5,210,042 | 5/1993 | Oshikawa ............... | 437/29 |

FOREIGN PATENT DOCUMENTS

| | | | |
|---|---|---|---|
| 0308152 | 3/1989 | European Pat. Off. ...... | 437/56 |
| 2111032 | 4/1990 | Japan .................. | 437/57 |
| 2224223 | 9/1990 | Japan .................. | 437/56 |
| 3250660 | 11/1991 | Japan . | |

Primary Examiner—Brian E. Hearn
Assistant Examiner—Michael Trinh

[57] ABSTRACT

A method for reducing implant-induced damage and residual photo-resist-induced damage to a gate insulator layer first forms a gate insulator layer on portions of a semiconductor substrate. A first gate electrode layer is formed over the gate insulator layer, this first gate electrode layer being thinner than the desired final gate electrode thickness. A threshold adjustment implant is performed through the first, thin, gate electrode layer and underlying gate insulator layer. A second gate electrode layer is formed over the first gate electrode layer such that the thickness of the first and second gate electrode layers are substantially equal to the desired final gate electrode thickness. The first and second gate electrode layers are then patterned concurrently by conventional photolithography processes to form the gate electrodes. These steps prevent the attachment of resist particles to the gate insulator layer and prevent the ion implant-induced damage to the gate insulator by using the first gate electrode layer as a buffer.

19 Claims, 6 Drawing Sheets

MOS MANUFACTURING PROCESS HAVING REDUCED GATE INSULATOR DEFECTS

BACKGROUND OF THE INVENTION

1. Field of the Invention

This invention relates to a metal-oxide-semiconductor (MOS) device manufacturing process, and more particularly to a method of reducing gate insulator defects caused by both photo-resist residues and ion implant damage.

2. Related Art

In conventional complementary metal-oxide-semiconductor (CMOS) manufacturing processes, ions are implanted in the active regions to adjust the threshold voltage of the P-channel and N-channel transistors, to be formed thereon. These threshold adjust implants are performed after the gate insulator layer is formed. Typically, the gate insulator layer is formed by thermal oxidation of the silicon in the active regions.

FIGS. 5A–5E show cross-sectional views of a wafer processed through the various manufacturing steps of a conventional CMOS manufacturing process. These figures show a semiconductor substrate 41, an N-well 42, a P-well 43, thick field oxide 44a for separating active regions 44b, a gate oxide layer 45, patterned photo-resist layers 46, 47, ion implant of $BF_2^+$ ions 48, and a gate electrode layer 49.

Figure 5A:
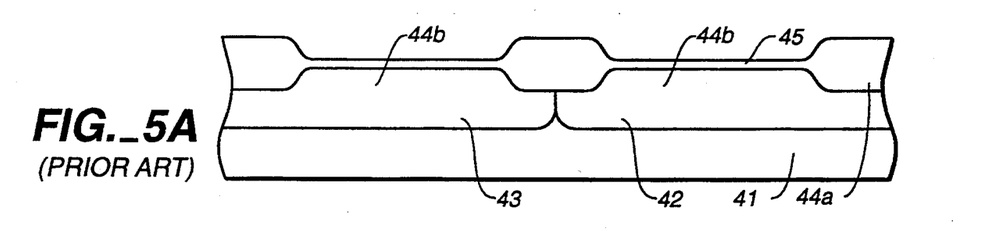
FIGS. 5A–5E show cross sectional drawings of the process steps of the technology of the prior art.

In this example, semiconductor substrate 41 is a P-type silicon substrate with a <100> planar surface. N-well 42 is formed through the ion implantation of phosphorous. P-well 43 is formed through the ion implantation of boron. After the N-well and P-well implants, four hours of thermal processing takes place at 1,200° C. in a mixed gas atmosphere of nitrogen and oxygen in a ratio of 9:1. After driving in N-well 42 and P-well 43, thick field oxide regions 44a are formed (separated by active regions 44b), followed by formation of a 150 Å gate oxide layer 45 as shown in FIG. 5A.

Most CMOS integrated circuits have both N-channel and P-channel transistors (MOSFETs) fabricated on a single semiconductor substrate. In order to form both types of MOSFETs on a single substrate requires that certain process steps be performed only upon the regions intended to contain transistors of one conductivity type or the other. For example, because the p-type source/drain junctions of P-channel transistors are typically formed by a boron implant, this implant must be masked from the areas containing the N-channel transistors. Similarly, because the n-type source/drain junctions of N-channel transistors are typically formed by an arsenic implant, this implant must be masked from the areas containing the P-channel transistors. There are other process steps that are appropriate only for one or the other conductivity type MOSFET. The process description below includes steps for isolating P-channel transistor formation activity from N-channel transistor formation activity.

Figure 5B:
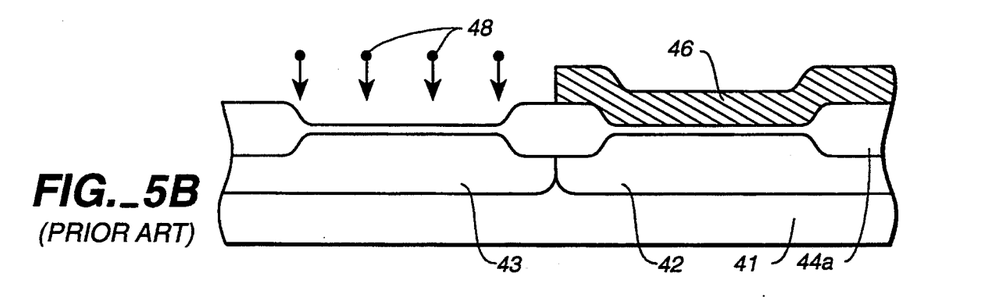

Referring to FIG. 5B, resist layer 46 is formed over gate oxide layer 45. This layer has an opening for an area that will become the channel regions of the N-channel transistors. Channel doping with $BF_2^+$ ions 48 takes place under the conditions of 40 keV and $1.0 \times 10^{12}/cm^2$. This channel doping takes place so that the N-channel MOS transistor threshold voltage can be adjusted upward. Therefore, ions such as $BF_2^+$ ions or $B^+$ ions are used.

Figure 5C:
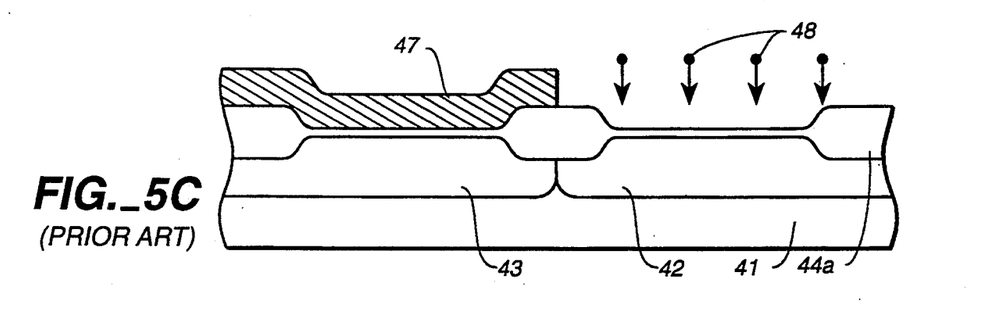
Figure 5D:
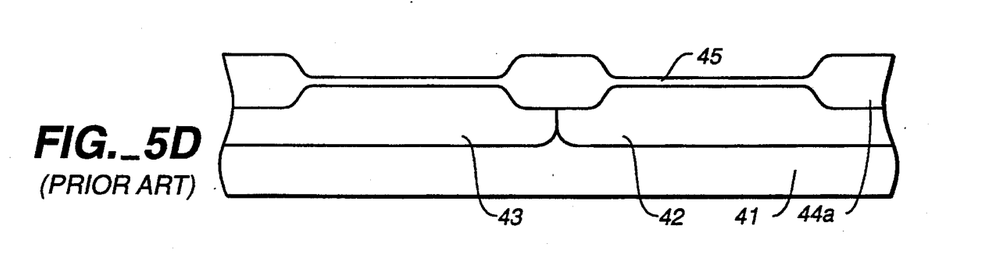

Resist layer 46 is stripped by immersion in a mixed solution of heated sulfuric acid and a hydrogen peroxide. After removing resist layer 46, resist layer 47 is formed, as shown in FIG. 5C. Resist layer 47 has openings that will become the channel regions of P-channel transistors. Channel doping with $BF_2^+$ ions 48 takes place under the conditions of 40 keV and $1.8 \times 10^{12}/cm^2$. This channel doping ion implant takes place so that the P-channel transistor threshold voltage can be adjusted upward. Ions such as $BF_2^+$ ions and $B^+$ ions are used in the same manner. Resist layer 47 also is removed by immersion in a mixed solution of heated sulfuric acid and hydrogen peroxide, resulting in the structure shown in FIG. 5D.

Notwithstanding the resist stripping process, the inorganic oxides of the resist material will not dissolve in the sulfuric acid and, therefore, will remain. This residue will be unevenly distributed on the surface of gate oxide layer 45 at a thickness of from 5 Å to 10 Å. The removal of the residue takes place through etching in a hydrogen fluoride solution. For example, it takes place through etching for ten seconds in $HF:H_2O = 1:200$.

Figure 5E:
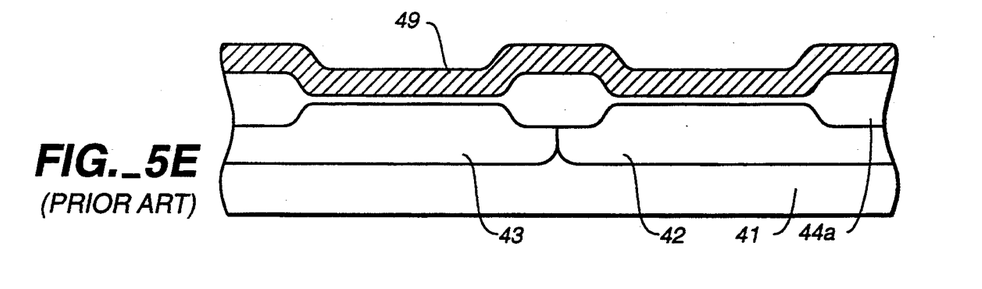

Referring to FIG. 5E, a polycrystalline silicon layer about 4,000 Å thick is formed as gate electrode layer 49. Through the diffusion of N-type ions, the polycrystalline silicon layer is made into an N-type polycrystalline silicon layer.

Subsequently, conventional manufacturing process steps are used to produce a CMOS integrated circuit (IC).

In conventional manufacturing as described above, the threshold adjust implant is done after gate oxide formation, but before gate electrode formation. The gate oxide layer is typically damaged as a result of the ion implantation.

Figure 6:
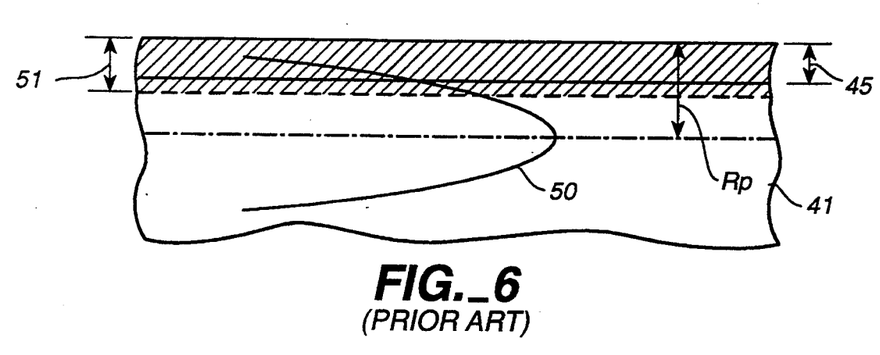
FIG. 6 shows the gate insulation region subject to implant-induced damage in conventional processes.

The damage to the gate oxide layer is depicted in FIG. 6 which shows implant profile 50 and defect layer 51. $R_p$, which is the peak depth of the ion implantation, is 370 Å at an energy of 40 keV. The region from 60% to 70% of $R_p$ is the layer in which defects will appear easily. Defect layer 51 represents this. In this case, the depth of the implant-induced defect has reached 220 Å. If the thickness of gate insulation layer 45 is 150 Å, there will be a lot of defects within gate insulation layer 45.

In addition, in the resist application and removal process steps before and after ion implantation, there are about 5 Å to 10 Å of particles that remain on the gate insulation layer, for example, particles such as $Al_2O_3$ or MgO. The surface of the gate oxide layer is etched about 10 Å in the etching process step that uses the hydrogen fluoride solution described above. The entire gate oxide layer becomes thinner and, at the same time, deep etching occurs in some places, causing defects.

As the degree of integration increases, the gate oxide layer becomes thinner. For example, in a 0.8 micron process, gate oxide thickness is from 150 Å to 180 Å. In a 0.5 micron process, gate oxide thickness is from 120 Å to 150 Å. In a 0.3 micron process, gate oxide thickness is from 100 Å to 120 Å. As a consequence of the reduction of gate insulator thickness, the gate insulator becomes more sensitive to the defect mechanisms described above.

SUMMARY OF THE INVENTION

It is an object of the present invention to reduce damage to the gate oxide caused by ion implantation.

It is a further object of this invention to reduce gate oxide defects caused by removal of residual photo-resist particles.

Briefly, a manufacturing process according to the present invention provides a method for reducing implant-induced damage and residual photo-resist-induced damage to a gate insulator layer. A gate insulator layer is first formed on portions of a semiconductor substrate. A first gate electrode layer is formed over the gate insulator layer, this first gate electrode layer being thinner than the desired final gate electrode thickness. A threshold adjustment implant is performed through the first, thin, gate electrode layer and underlying gate insulator layer. A second gate electrode layer is formed over the first gate electrode layer such that the thickness of the first and second gate electrode layers are substantially equal to the desired final gate electrode thickness. The first and second gate electrode layers are then patterned together by conventional photolithography processes to form the gate electrodes. These steps prevent the attachment of resist particles to the gate insulator layer and prevent the ion implant-induced damage to the gate insulator by using the first gate electrode layer as a buffer.

The first and second layers used to construct the final gate electrode layer are not necessarily the same material. For example, the thin first layer may comprise polycrystalline silicon or amorphous silicon, while the second, thicker, layer may comprise polycrystalline silicon, amorphous silicon, tungsten silicide, molybdenum silicide, or titanium silicide.

Other objects, advantages and attainments together with a fuller understanding of the invention will become apparent and appreciated by referring to the following description and claims taken in conjunction with the accompanying drawings.

BRIEF DESCRIPTION OF THE DRAWINGS

Appendix I provides a reference numeral identification table for the convenience of the reader.

DETAILED DESCRIPTION OF THE INVENTION

Terminology

The terms gate oxide and gate insulator are used herein to refer to the material which, in a MOSFET, separates the gate electrode from the channel region. Gate insulator is a broader term since it does not specify that an oxide is used as the insulating material.

Typically, MOSFETs are formed dose to the surface a semiconductor wafer, in regions referred to alternatively as active regions, source/drain (S/D) regions, mesa regions, or element formation regions. These are terms that are generally understood to be interchangeable in this field. Active region is the expression used herein and it is intended to cover all other similar expressions. Active regions are isolated from each other by regions of thick field oxide.

The expressions polycrystalline silicon, polysilicon, and poly-Si are used interchangeably herein. The expressions amorphous silicon and a-Si are used interchangeably herein.

Process Flow

FIGS. 1A–3D are drawings of the wafer cross-sections of a MOSFET region showing the results of the manufacturing process steps of one embodiment of the present invention. Shown in FIGS. 1A–3D are an n-type silicon substrate 11, a silicon dioxide layer 12, a silicon nitride layer 13, boron ions 14, a stopper region 15, a thick field oxide layer 16a, an active region 16b, silicon dioxide layers 17, 18, poly-Si layers 19a, 19b, 19c photo-resist 20, $BF_2^+$ ions 21, phosphorous ions 22, a low concentration dopant diffusion layer 23, an oxide layer 24, a silicon dioxide layer 25 a side wall 26, phosphorous ions 27, a high concentration dopant diffusion layer 28, an interlayer dielectric 29, aluminum 30, and a passivation layer 31.

First, boron ions are implanted in n-type silicon substrate 11 to form P-wells (not shown). Next, thermal oxidation takes place in the presence of steam at 950° C. on n-type silicon substrate 11 to form silicon dioxide layer 12 having a thickness of approximately 1,000 Å. A 1,600 Å silicon nitride layer 13 is deposited on silicon dioxide layer 12 using the CVD method. After this, photographic etching is used to leave only silicon nitride layer 13 in the active region. Then, photo-resist is applied. The photo-resist is patterned so that openings exist in the p-type stopper formation area, and then the implantation of boron ions 14 takes place under the conditions of 40 keV of energy and a dose of $3 \times 10^{12}/cm^2$.

Figure 1A:
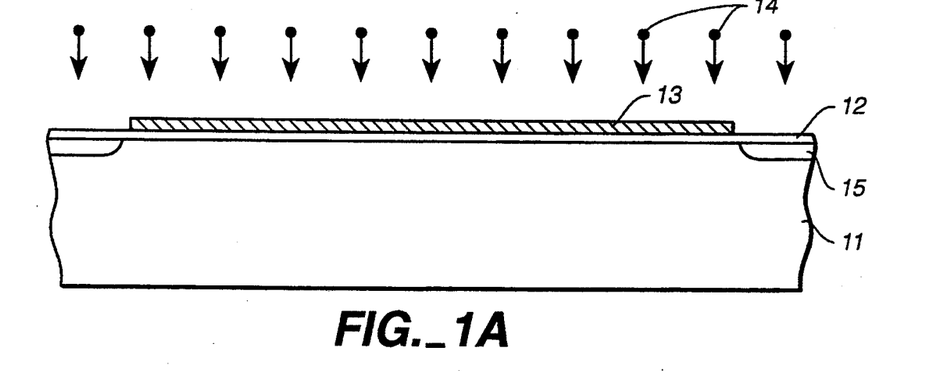
FIGS. 1A–1D are wafer cross-sectional drawings showing the results of the process steps of an illustrative embodiment of the present invention.

After this, the resist is removed, and thermal processing takes place to form stopper region 15 (FIG. 1A). The conditions of the thermal processing are, for example, an atmosphere of 100% nitrogen or a gas mixture of nitrogen and oxygen in a ratio of 9:1 at 1,000° C. for 30 minutes. This thermal processing can restore the defects that appear in the silicon substrate due to the ion implantation for forming the N-channel stopper region.

In FIG. 1A, the well region is not illustrated. Also, in the manufacturing process steps up to this point, it is not necessary to form both the P-wells and the N-wells. The well region of the channel elements of one (or the other) can be formed and the other channel element can be formed on the substrate itself, not as a well. In other words, it is immaterial whether a twin-well, N-well, or P-well CMOS process is used to embody the present invention.

Figure 1B:
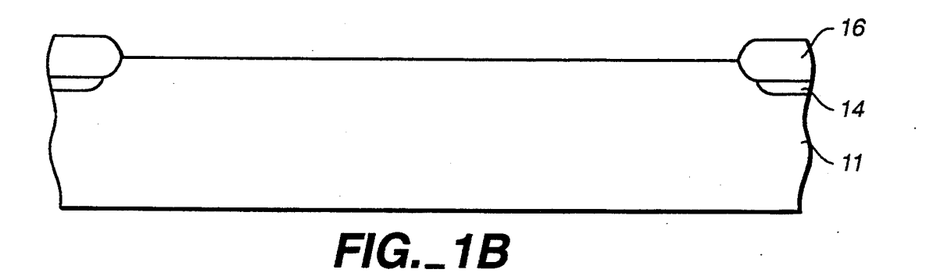

Silicon nitride layer 13 can be used as a mask and selective oxidation can take place using thermal oxidation in the presence of steam at 950° C. to form thick field oxide layer 16a approximately 7,000 Å thick. After this, silicon nitride layer 13 is removed (FIG. 1B).

Figure 1C:
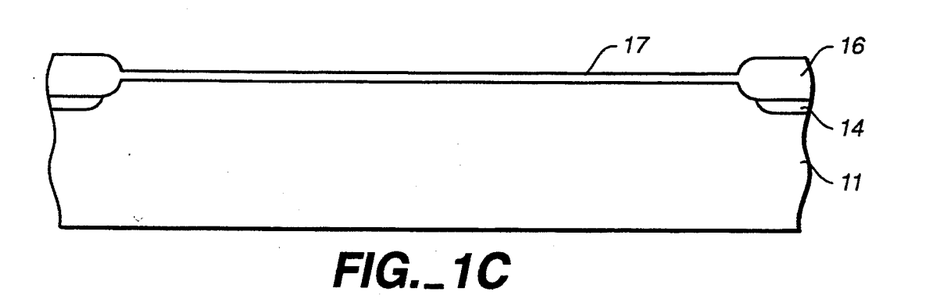
Figure 1D:
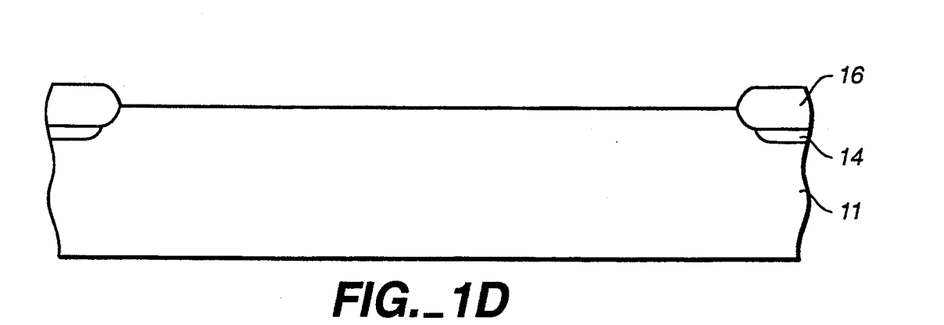

Next, thermal oxidation at 850° C. for 18 minutes takes place as a sacrificial oxidation to form a silicon dioxide layer 17 of 250 Å thick on the active region 16b (FIG. 1C). Then, silicon dioxide layer 17 is etched in a solution that contains hydrofluoric acid (FIG. 1D). During the formation of field oxide layer 16a, the silicon nitrides, such as SiON or $Si_3N_4$ that are formed on the end of the field oxide layer, can be removed by the formation and removal of silicon dioxide layer 17.

Figure 2A:
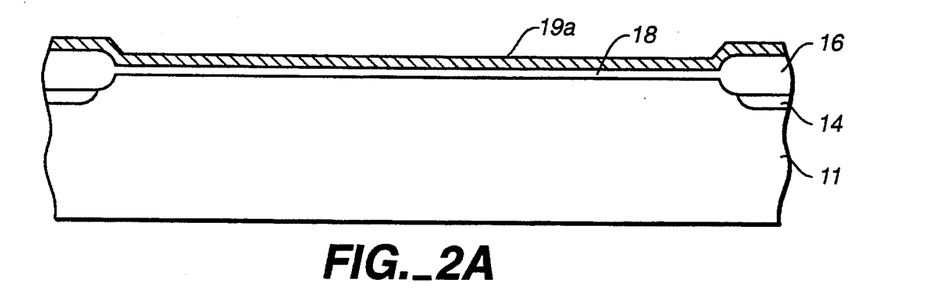
FIGS. 2A–2D are wafer cross-sectional drawings showing the results of the process steps of an illustrative embodiment of the present invention.

Next, thermal oxidation at 850° C. for 9 minutes takes place to form a silicon dioxide layer 18 that is 150 Å thick in active region 16b, and this will become the gate insulation layer of the MOSFETs. After this, poly-Si layer 19a, about 200 Å thick, is deposited on the entire wafer using the CVD method (FIG. 2A). Poly-Si layer 19a is formed as the gate electrode. However, in the process step, the gate electrode layer is not formed at the required thickness, but at a thickness thinner than that required. This is to prevent it from obstructing the ion implantation that will be described below.

Figure 2B:
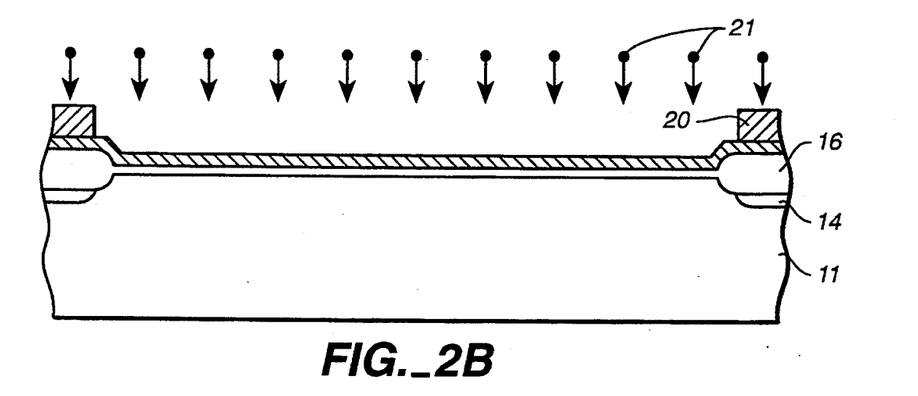

Next, a layer of resist 20, which at least has openings for the channels of the N-channel region, is patterned. The implantation of boron or $BF_2^+$ ions 21 is done in order to allow the adjustment of the MOSFET threshold voltage.

Figure 2C:
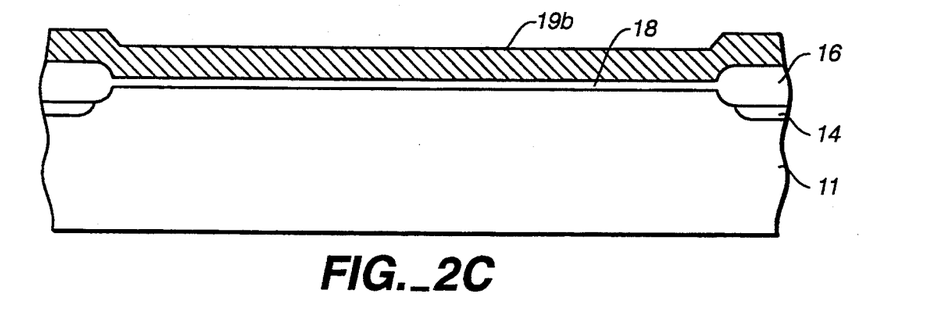

After removing resist 20 and after thermal processing takes place at 1000° C. in a nitrogen gas atmosphere for 20 minutes, an additional poly-Si layer is deposited on poly-Si layer 19a and on the entire surface of the wafer using the CVD method. As a result of this, the total thickness of poly-Si 19b is about 4,500 Å. Poly-Si layer 19b is made into an n-type high concentration dopant diffusion layer by the implantation of phosphorous ions under the conditions of 80 keV of energy and a dose of $4 \times 10^{15}/cm^2$ (FIG. 2C).

Figure 2D:
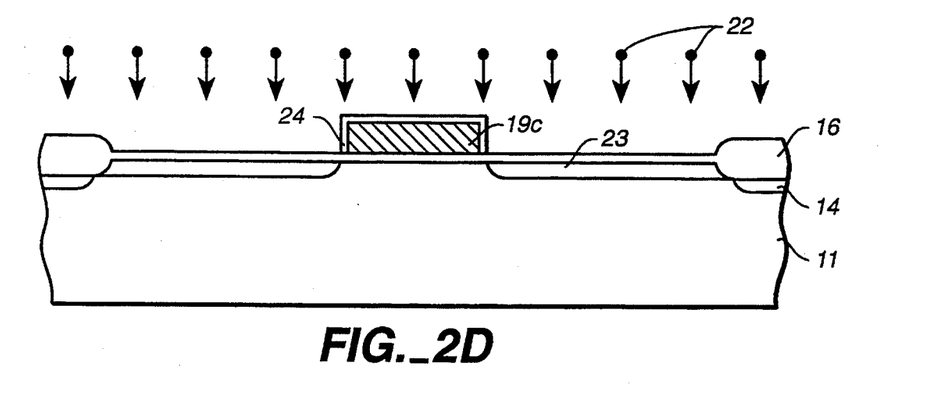

Next, the area that will become MOSFET gate electrode 19c is formed by a known etching method. After this, the photographic etching method will be used to make openings for the active region in the N-channel transistor formation region. The implantation of phosphorous ions 22 will be used to form a low concentration dopant diffusion layer 23 in the offset region of the high breakdown voltage transistor. Before implanting phosphorous ions 22, the surface of gate electrode 19c should be oxidized to form oxide layer 24 (FIG. 2D).

Figure 3A:
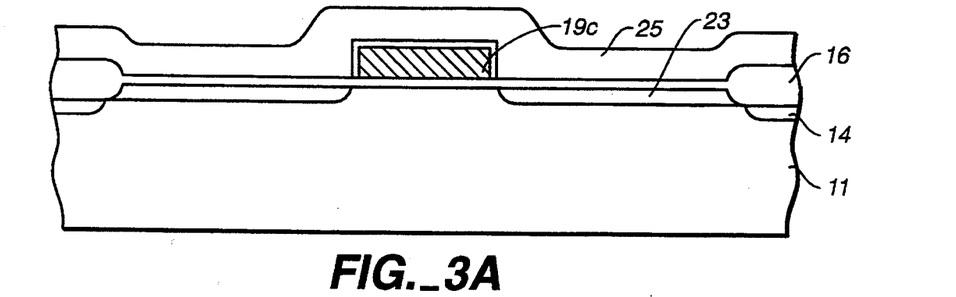
FIGS. 3A–3D are wafer cross-sectional drawings showing the results of the process steps of an illustrative embodiment of the present invention.
Figure 3B:
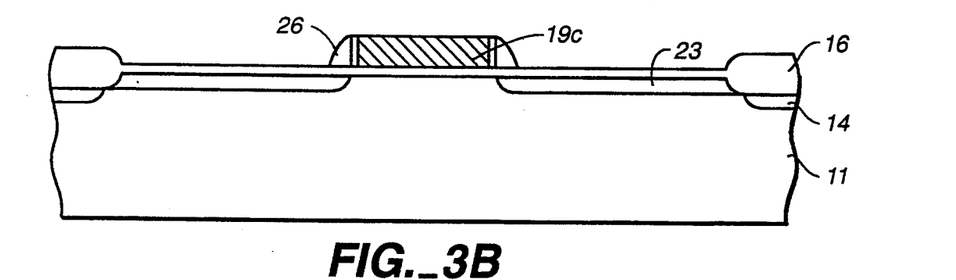
Figure 3C:
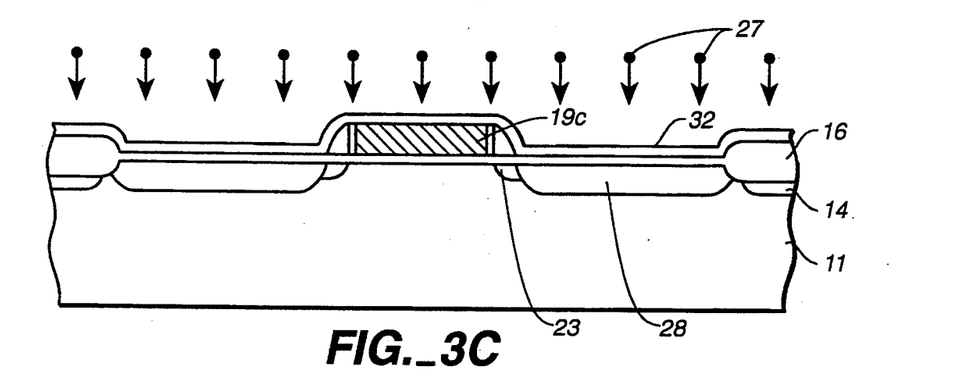

Next, a one micron silicon dioxide layer 25 is deposited on the entire wafer using the CVD method (FIG. 3A). Silicon dioxide layer 25 is then etched using anisotropic etching to form side walls 26 of gate electrode 19c (FIG. 3B). Silicon dioxide layer 32 is deposited on the entire surface of the wafer at a thickness of 200 Å using CVD. After this, active openings are made in the N-channel transistor formation region using the photographic etching method. High concentration dopant diffusion layer 28 is formed as the transistor source and drain regions by means of the implantation of phosphorous ions 27 (FIG. 3C).

Figure 3D:
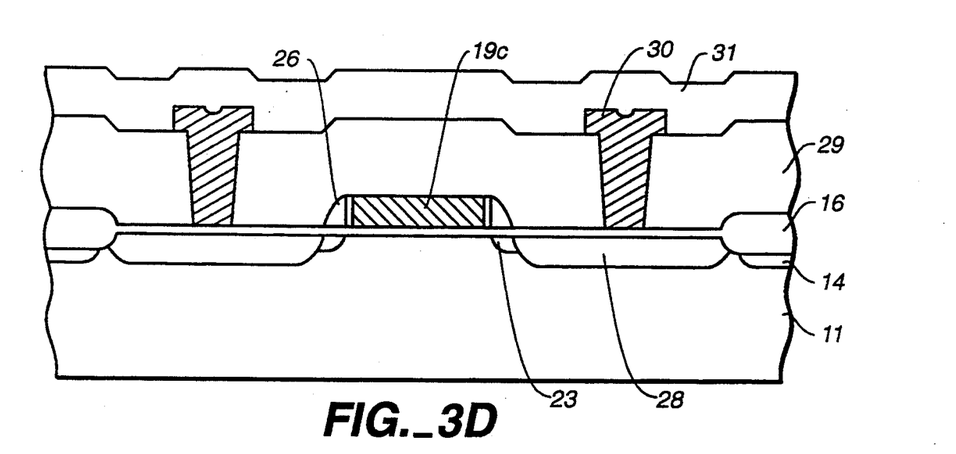

The following process steps deposit a 1,000 Å natural silicate glass (NSG) layer and a 5,000 Å bore-phosphorous-silicate-glass (BPSG) layer on the entire wafer which together form an interlayer dielectric 29, following standard methods. Source and drain contact holes are formed using the photographic etching method. After this, electrode interconnect aluminum 30 is sputtered on. Patterning takes place using photographic etching, and the aluminum interconnects are formed. Then, as a passivation layer, a silicon dioxide layer is deposited using CVD (FIG. 3D). After the pad openings are made using photographic etching, an area of the pads of the passivation layer is removed using a solution containing hydrofluoric acid, and the electrode outlet is formed.

FIGS. 4A–4F show the present invention used in a CMOS process.

Figure 4A:
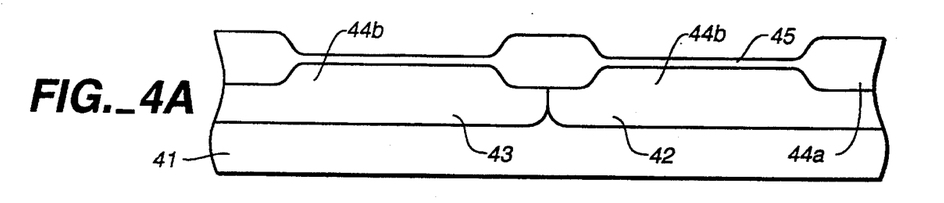
FIGS. 4A–4F are wafer cross-sectional drawings showing the results of the process steps of a CMOS embodiment of the present invention.

Semiconductor substrate 41 is a P-type silicon substrate with a <100> planar surface. N-well 42 is formed through the ion implantation of phosphorous. P-well 43 is formed through the ion implantation of boron. Next, four hours of thermal process takes place at 1,200° C. in a mixed gas atmosphere of nitrogen and oxygen at a 9:1 ratio. After driving in N-well 42 and P-well 43, a thick field oxide layer 44 and a 150 Å gate oxide layer 45 are formed (FIG. 4A).

Figure 4B:
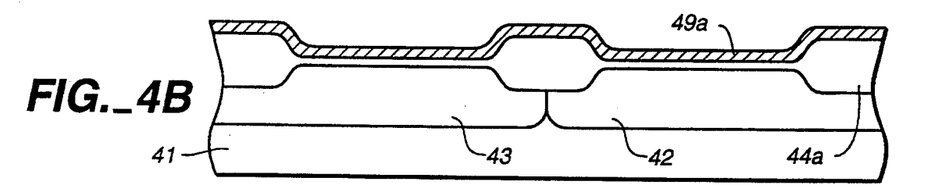

In addition, a 300 Å poly-Si layer is deposited over the entire wafer using CVD (FIG. 4B). A gate electrode layer 49a is formed of poly-Si. However, as stated above, in this process, the gate electrode layer is formed at a thickness that is thinner than that required.

Figure 4C:
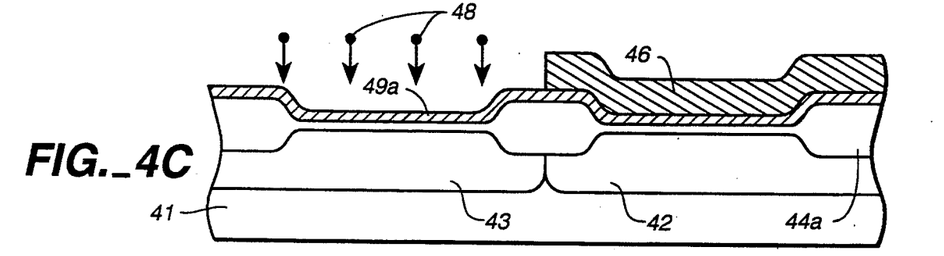

On top on this, photo-resist layer 46 is formed. Photo-resist layer 46 has an opening for an area that will become the channel region at least of an N-channel transistor. Channel doping with $BF_2^+$ ions 48 takes place under the conditions of 60 keV and $1.0 \times 10^{12}/cm^2$ (FIG. 4C). This channel doping takes place so that the MOSFET threshold voltage can be adjusted upward. Therefore, ions such as $BF_2^+$ ions or $B^+$ ions are used.

Figure 4D:
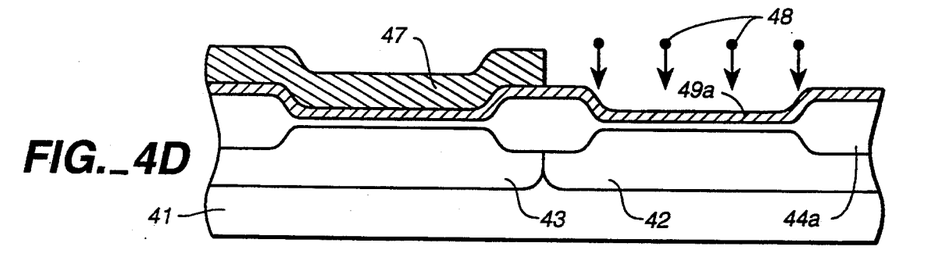

Stripping of resist layer 46 takes places by immersion in a mixed solution of heated sulfuric acid and a hydrogen peroxide solution. After removing resist layer 46, resist layer 47 is formed. This layer has openings that will become the channel region of a P-channel transistor. The channel will be doped by implanting $BF_2^+$ ions 48 under the conditions of 60 keV and $1.8 \times 10^{12}/cm^2$ (FIG. 4D). This channel doping takes place so that the threshold voltage of the MOS transistor can be adjusted upward. However, ions such as $BF_2^+$ ions and $B^+$ ions are used in the same manner. Resist layer also is removed by immersion in a mixed solution of heated sulfuric acid and hydrogen peroxide (FIG. 4D).

Figure 4E:
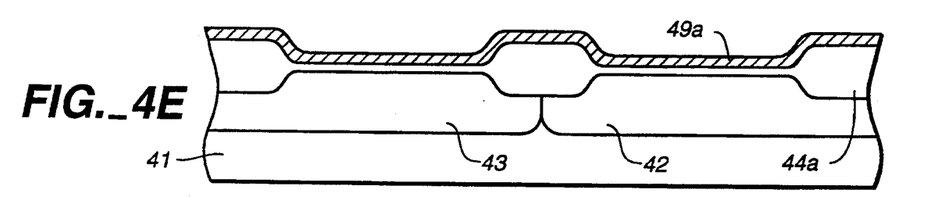

Even if the stripping process takes place, the inorganic oxides of the resist material will not dissolve in the sulfuric acid and, therefore, will remain. To remove this residue, etching takes place in a hydrogen fluoride solution. For example, it takes place by etching for ten seconds in $HF:H_2O = 1:200$ (FIG. 4E).

Figure 4F:
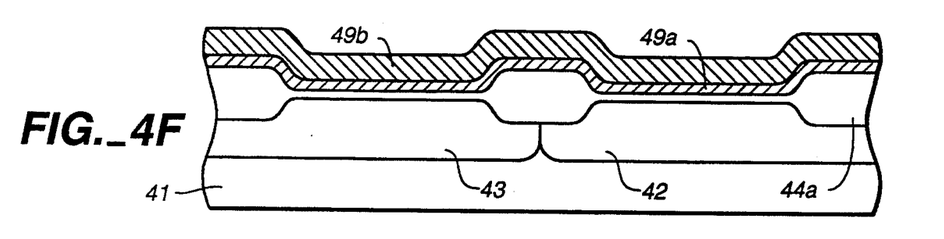

In addition, a poly-Si layer about 3,700 Å is formed as gate electrode layer 49b. Through the diffusion of N-type ions, the poly-Si layer is made into an N-type poly-Si (FIG. 4F).

Subsequently, this device is made into a CMOS IC through conventional CMOS manufacturing process steps.

Figure 7:
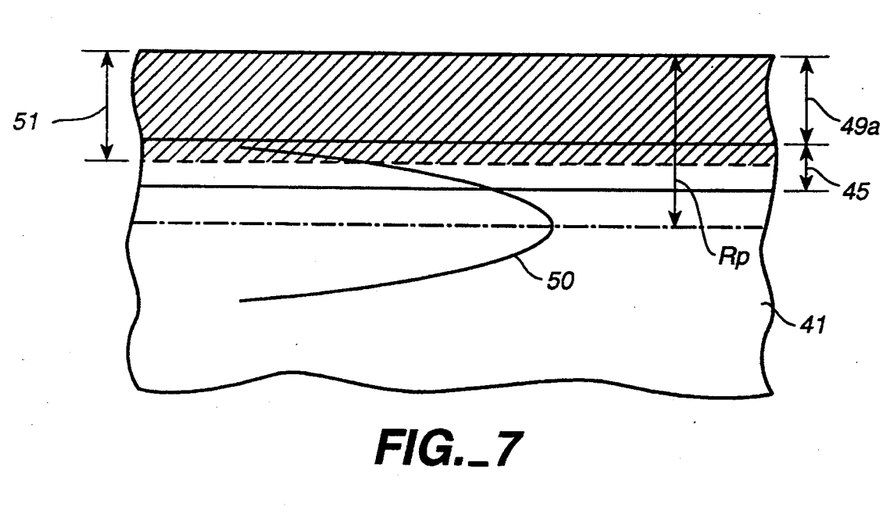
FIG. 7 shows the gate insulation region subject to implant-induced damage in the process of the present invention.

FIG. 7 describes the ion implantation for adjusting the threshold voltage using this invention. A gate electrode layer 49a, a concentration profile 50, and a defect layer 51 are shown. As can be understood by a comparison with FIG. 6, when the threshold adjust implant is done, gate electrode layer 49a has already been formed on top of gate oxide layer 45. Gate electrode layer 49a is thinner than the final desired thickness for the gate electrode layer. For example, assume that the thickness of gate oxide layer 45 is 150 Å and that of gate electrode layer 49a is 300 Å. Because a thickness of 4,000 Å is required for the final gate electrode layer, gate electrode layer 49a is only one part of the final gate electrode layer. If ion implantation at an energy level of 60 keV is applied to this, Rp, the peak depth of the implantation, will be 600 Å. The depth of defect layer 51 will be 360 Å. Therefore, even if defects appear in gate insulation layer 45, they will only appear in an area with a surface depth of 60 Å. At this level, the damage to gate insulation layer 45 is not a problem, and the reduction in the breakdown voltage due to defects is eliminated.

In addition, in the etching process for eliminating the resist residue, the gate oxide layer is not exposed to an etching solution and layer reduction does not take place. Thus, changes in MOSFET electrical characteristics can be prevented.

The reason gate electrode layer 49a is not the final gate electrode layer is because the implantation energy during ion implantation is not large. As explained using FIG. 7, an appropriate thickness can be set in relationship to the depth in which defects are easily created.

Alternatives

In the embodiments described above, a poly-Si layer was used as the gate electrode layer. However, any layer that can be used as a gate electrode is acceptable. It is not limited to poly-Si. An a-Si layer also can be used. In addition, the gate electrode layer that is formed first in thin form and the gate electrode layer that is formed on top of that layer are not required to be made of the same material. It is possible to form the poly-Si layer in thin form first, and, after ion implantation, form an a-Si layer on top of that layer to achieve the predetermined thickness of the gate electrode layer.

Of course, the a-Si layer may be formed first, and after the ion implantation, a poly-Si layer may be formed on top of it. Further, the poly-Si layer or the a-Si layer may be formed thinly at first, at a thickness of from 1,500 Å to 2,000 Å. Then, after ion implantation, a metal silicon layer, such as $WSi_2$, $MoSi_2$, or $TiSi_2$, 2,500 Å thick may be formed to produce a polycide type gate electrode layer.

As is clear from the preceding description, the method of the present invention is used to form a first gate electrode layer subsequent to gate insulator formation. The damage to the gate insulator layer typically caused by ion implantation can be prevented in this way. Additionally this method can prevent the attachment of residual photo-resist particles to the gate insulator layer.

Those skilled in the art will recognize that the method described herein is applicable to the manufacture of MOS capacitors as well as transistors. The steps are substantially the same with the exception that source/drain regions need not be formed in order to produce a two terminal capacitor structure. More particularly, a method of forming an MOS capacitor having two terminals comprises the steps of forming an insulator layer having a predetermined thickness, over a portion of the surface of a semiconductor substrate, forming a first electrode layer having a predetermined thickness, over the insulator layer, implanting dopant ions of a first conductivity type at a predetermined dose and energy through the first electrode layer and the insulator layer to form a first terminal of the capacitor, forming a second electrode layer having a predetermined thickness, over the first electrode layer and etching the second and first electrode layers to form a second terminal of the capacitor.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the subjoined claims.

APPENDIX I: Reference Numeral Identification

1. N-type silicon substrate
12. silicon dioxide layer
13. silicon nitride layer
14. boron ions
15. stopper region
16a. thick field oxide layer
16b. active region
17. silicon dioxide layer
18. silicon dioxide layer
19a. first poly-Si layer
19b. second poly-Si layer
19c. patterned poly-Si gate electrode
20. photo-resist
21. $BF_2^+$ ions
22. phosphorous ions
23. low concentration dopant diffusion layer
24. silicon dioxide layer
25. silicon dioxide layer
26. side wall
27. phosphorous ions
28. high concentration dopant diffusion layer
29. interlayer dielectric
30. aluminum
31. passivation layer
32. silicon dioxide layer
41. semiconductor substrate
42. N-well
43. P-well
44a. thick field oxide layer
44b. active region
45. gate oxide layer
46. photo-resist layer
47. photo-resist layer
48. $BF_2^+$ ions
49. gate electrode layer
49a. gate electrode layer
49b. gate electrode layer
50. concentration profile
51. defect layer

What is claimed is:

1. A method of adjusting MOSFET threshold voltage comprising the steps of:
   a) forming a gate insulator layer having a first thickness, over a portion of the surface of a semiconductor substrate;
   b) forming a first gate electrode layer having a second thickness, over said gate insulator layer;
   c) implanting dopant ions of a first conductivity type at a first energy through said first gate electrode layer and said gate insulator layer, wherein said first energy substantially determines the peak depth of a doping profile resulting from said step of implanting;
   d) forming a second gate electrode layer having a third thickness which is a magnitude larger than the second thickness, over said first gate electrode layer;
   e) etching said second and said first gate electrode layers to form at least one gate electrode; and f) implanting at least one source and at least one drain, each said source and each said drain being self-aligned to one of said at least one gate electrodes; and g) preventing defects in the surface of the semiconductor substrate by implanting the dopant ions in step c) at a low energy level and by maintaining the thicknesses of the gate insulator layer and first electrode layer relatively large such that the sum of the first and second thicknesses is greater than 70% of the peak depth of the doping profile.

2. The method of claim 1 wherein said gate insulator is an oxide of silicon.

3. The method of claim 1 wherein said first gate electrode layer comprises polycrystalline silicon.

4. The method of claim 1 wherein said second gate electrode layer comprises polycrystalline silicon.

5. A method of adjusting a first conductivity type MOSFET threshold voltage and a second conductivity type MOSFET threshold voltage in a process for making both said first conductivity type MOSFET and said second conductivity type MOSFET on a single semiconductor substrate, comprising the steps of:

a) forming a gate insulator layer having a first thickness over portions of a surface of a semiconductor substrate, including areas for forming said first conductivity type MOSFETs and areas for forming said second conductivity type MOSFETs;

b) forming a first gate electrode layer having a second thickness, over at least said gate insulator layer;

c) forming a first photo-resist layer patterned such that areas for forming said first conductivity type MOSFETs are exposed;

d) implanting dopant ions at a first dose and a first energy through said first gate electrode layer and said gate insulator layer wherein said first energy substantially determines a first peak depth of a first doping profile resulting from said step (d) implanting;

e) removing said first photo-resist layer;

f) forming a second photo-resist layer patterned such that areas for forming said second conductivity type MOSFETs are exposed;

g) implanting dopant ions at a second dose and a second energy through said first gate electrode layer and said gate insulator layer wherein said second energy substantially determines a second peak depth of a second doping profile resulting from said step (g) implanting;

h) forming a second gate electrode layer having a third thickness which is a magnitude larger than the second thickness, over said first gate electrode layer;

i) etching said second and said first gate electrode layers to form at least one gate electrode;

j) forming at least one p-type source, at least one p-type drain, at least one n-type source and at least one n-type drain; and k) preventing defects in the surface of the semiconductor substrate by implanting the dopant ions in steps d) and g) at a low energy level and by maintaining the thicknesses of the gate insulator layer and first electrode layer relatively large such that the sum of the first and second thicknesses is greater than 70% of the peak depth of the doping profile.

6. The method of claim 5 wherein said gate insulator layer is an oxide of silicon.

7. The method of claim 5 wherein said first gate electrode layer comprises polycrystalline silicon.

8. The method of claim 5 wherein said second gate electrode layer comprises polycrystalline silicon.

9. The method of claim 5 wherein said first gate electrode layer comprises a material selected from the group consisting of polycrystalline silicon and amorphous silicon, and said second gate electrode layer comprises a material selected from the group consisting of polycrystalline silicon, amorphous silicon, tungsten silicide, molybdenum silicide, and titanium silicide.

10. The method of claim 5 wherein said first dose of step (d) is different from said second dose of step (g).

11. The method of claim 5 wherein said first conductivity type MOSFET is an N-channel MOSFET and said second conductivity type MOSFET is a P-channel MOSFET.

12. The method of claim 5 wherein said first conductivity type MOSFET is a P-channel MOSFET and said second conductivity type MOSFET is an N-channel MOSFET.

13. The method of claim 5 wherein said dopant ions of step (d) are P-type ions, and said dopant ions of step (g) are P-type ions.

14. The method of claim 5 wherein said step of forming said p-type source and said p-type drain comprises ion implanting of boron ions.

15. The method of claim 5 wherein said step of forming said n-type source and said n-type drain comprises ion implanting of arsenic ions.

16. The method of claim 13 wherein said dopant ions comprise boron ions.

17. A method of forming an MOS capacitor having two terminals comprising the steps of:

a) forming an insulator layer having a first thickness, over a portion of the surface of a semiconductor substrate;

b) forming a first electrode layer having a second thickness, over said insulator layer;

c) implanting dopant ions of a first conductivity type at a first dose and a first energy through said first electrode layer and said insulator layer to form a first terminal of said capacitor wherein said first energy substantially determines a first peak depth of a first doping profile resulting from said step (c) implanting;

d) forming a second electrode layer having a third thickness which is a magnitude larger than the second thickness, over said first electrode layer;

e) etching said second and said first electrode layers to form a second terminal of said capacitor; and f) preventing defects in the surface of the semiconductor substrate by implanting the dopant ions in step c) at a low energy level and by maintaining the thicknesses of the gate insulator layer and first electrode layer relatively large such that the sum of the first and second thicknesses is greater than 70% of the peak depth of the doping profile.

18. The method of claim 17 wherein said insulator layer is an oxide of silicon, said first electrode layer comprises polycrystalline silicon, and said second electrode comprises polycrystalline silicon.

19. A method of forming a device including a semiconductor substrate, comprising the steps of:

a) forming an insulator layer having a first thickness over a portion of said semiconductor substrate;

b) forming a first conductive layer having a second thickness, over said insulator layer;

c) implanting dopant ions of a first conductivity type at a first dose and a first energy through said first conductive layer and said insulator layer wherein said first energy substantially determines a first peak depth of a first doping profile resulting from said step (c) implanting;

d) forming a second conductive layer having a third thickness which is a magnitude larger than the second thickness, over said first conductive layer;

e) etching said second and said first conductive layers to form a patterned electrode; and f) preventing defects in the surface of the semiconductor substrate by implanting the dopant ions in step c) at a low energy level and by maintaining the thicknesses of the gate insulator layer and first electrode layer relatively large such that the sum of the first and second thicknesses is greater than 70% of the peak depth of the doping profile.

* * * * *

UNITED STATES PATENT AND TRADEMARK OFFICE
CERTIFICATE OF CORRECTION

PATENT NO. : 5,407,839
DATED : April 18, 1995
INVENTOR(S) : Yutaka Maruo

It is certified that error appears in the above-identified patent and that said Letters Patent is hereby corrected as shown below:

ON THE TITLE PAGE:
Item [54]:

Please amend the title to read --SEMICONDUCTOR MANUFACTURING PROCESS HAVING REDUCED GATE INSULATOR AND SURFACE DEFECTS--.

Page 1, Item [30]:

Insert the following Foreign Application Priority Data:

--October 22, 1992 [JP] Japan ................................. 4-308203--.

Page 1, Item [57]:

Please delete the entire Abstract and insert therefor:

--ABSTRACT

Defects in the gate insulator layer and in the surface of the substrate are reduced by implanting ions through the gate insulator layer which is initially covered by the first layer of a two-layer gate electrode. The thicknesses of the gate insulator layer and first electrode layer are greater than 70% of the peak depth of the doping profile.--

UNITED STATES PATENT AND TRADEMARK OFFICE
CERTIFICATE OF CORRECTION

PATENT NO. : 5,407,839
DATED : April 18, 1995
INVENTOR(S) : Yutaka Maruo

It is certified that error appears in the above-identified patent and that said Letters Patent is hereby corrected as shown below:

Column 1, line 54, delete "MOSFET" and insert therefor --MOSFETS--.

Column 2, line 2, delete "a".

Column 2, line 21, delete "through" and insert --by-- therefor.

Column 2, line 53, after "layer" insert --thus--.

Please delete the text from column 2, line 64 to column 3, line 31 and insert the following therefor:

--It is, of course, also important that defects in the surface of the semiconductor substrate be kept to a minimum. While the prior art may have attempted to reduce contamination of the gate insulator layer in some instances, it fails to recognize that such procedures can cause defects in the surface of the substrate unless certain relationships between various processing parameters are maintained.

SUMMARY OF THE INVENTION

It is, therefore, an object of this invention to reduce damage to the gate insulator layer while at the same time preventing defects in the surface of the semiconductor substrate.

In accordance with the teachings of the present invention, a method for forming a device having a semiconductor substrate is disclosed. An insulator layer having a first thickness is formed over a portion of the semiconductor substrate. A first conductive layer having a second thickness is formed over the insulator layer. Dopant ions of a first conductivity type at a first dose and a first energy level are implanted through the first conductive layer and the insulator layer. The energy level substantially determines a peak depth of a doping

UNITED STATES PATENT AND TRADEMARK OFFICE
CERTIFICATE OF CORRECTION

PATENT NO. : 5,407,839        Page 3 of 4
DATED : April 18, 1995
INVENTOR(S) : Yutaka Maruo It is certified that error appears in the above-identified patent and that said Letters Patent is hereby corrected as shown below:

profile resulting during the implantation. A second conductive layer having a third thickness which is a magnitude larger than the second thickness is then formed over the first conductive layer. The second and first conductive layers are then etched to form a patterned electrode. Defects in the surface of the semiconductor substrate are prevented by implanting the dopant ions at a low energy level and by maintaining the thicknesses of the first insulator layer and the first electrode layer so that they are relatively large, with the sum of the first and second thicknesses being greater than 70% of the peak depth of the doping profile.--

Column 5, line 59, delete "bore-phosphorous-silicate-glass" and insert

--boron-phosphorous-silicate-glass-- therefor.

<u>In the Claims</u>:

Column 9, line 5, delete "preventing" and insert --wherein-- therefor.

Column 9, line 6, after "substrate" insert --are prevented--.

Column 9, line 59, delete "preventing" and insert --wherein-- therefor.

Column 9, line 60, after "substrate" insert --are prevented--.

Column 10, line 52, delete "preventing" and insert --wherein-- therefor.

Column 10, line 53, after "substrate" insert --are prevented--.

UNITED STATES PATENT AND TRADEMARK OFFICE
CERTIFICATE OF CORRECTION

PATENT NO. : 5,407,839
DATED : April 18, 1995
INVENTOR(S) : Yutaka Maruo

It is certified that error appears in the above-identified patent and that said Letters Patent is hereby corrected as shown below:

Column 12, line 3, delete "preventing" and insert --wherein-- therefor.

Column 12, line 4, after "substrate" insert --are prevented--.

Signed and Sealed this

Twenty-third Day of December, 1997

Attest:

BRUCE LEHMAN

*Attesting Officer*  *Commissioner of Patents and Trademarks*